(12) United States Patent
Park et al.

(10) Patent No.: US 12,715,686 B2
(45) Date of Patent: Aug. 25, 2026

(54) DEVICE AND METHOD FOR PLACING RACKS

(71) Applicants: Hyundai Motor Company, Seoul (KR); Kia Corporation, Seoul (KR)

(72) Inventors: Hyejun Park, Seoul (KR); Sunjoo Moon, Suwon-si (KR); Wonseok Choi, Seongnam-si (KR)

(73) Assignees: Hyundai Motor Company, Seoul (KR); Kia Corporation, Seoul (KR)

( * ) Notice: Subject to any disclaimer, the term of this patent is extended or adjusted under 35 U.S.C. 154(b) by 402 days.

(21) Appl. No.: 18/538,839

(22) Filed: Dec. 13, 2023

(65) Prior Publication Data

US 2024/0343483 A1 Oct. 17, 2024

(30) Foreign Application Priority Data

Apr. 14, 2023 (KR) ........................ 10-2023-0049481
Jul. 31, 2023 (KR) ........................ 10-2023-0099359

(51) Int. Cl.
*B65G 1/02* (2006.01)
*G06F 30/20* (2020.01)

(52) U.S. Cl.
CPC ............... *B65G 1/02* (2013.01); *G06F 30/20* (2020.01); *B65G 2207/08* (2013.01)

(58) Field of Classification Search
CPC ........ B65G 1/02; B65G 2207/08; G06F 30/20
See application file for complete search history.

(56) References Cited

U.S. PATENT DOCUMENTS 10,796,278 B1 * 10/2020 Wintz .................... G06Q 10/08

FOREIGN PATENT DOCUMENTS

| | | | | | |
|---|---|---|---|---|---|
| CN | 106777607 | A | * | 5/2017 | G06F 30/20 |
| CN | 115099061 | A | * | 9/2022 | G06Q 10/0639 |
| CN | 118378316 | A | * | 7/2024 | G06T 17/00 |
| CN | 118521253 | A | * | 8/2024 | G06Q 10/103 |
| KR | 20210085584 | A | * | 7/2021 | G06F 30/12 |
| WO | WO-2017059140 | A1 | * | 4/2017 | G06Q 10/063 |

OTHER PUBLICATIONS

CN_115099061_EN (Year: 2022).*
CN_106777607_EN (Year: 2017).*
CN_118378316_EN (Year: 2024).*

* cited by examiner

*Primary Examiner* — Jacob S. Scott
*Assistant Examiner* — Erin Morris
(74) *Attorney, Agent, or Firm* — Slater Matsil, LLP

(57) ABSTRACT

An embodiment device for placing racks includes a rack modeling calculation formula-provision module configured to provide a predetermined rack modeling calculation formula for the racks including a pallet, a load beam, a frame column, a connection part between the load beam and the frame column, or a support, a rack modeling module configured to perform rack modeling by calculating the rack modeling calculation formula based on a value of a preset variable, a rack placement module configured to place the racks modeled based on a predetermined rack placement condition, and a recommendation module configured to recommend a transportation device or a pallet suitable for placement of the racks based on a rack placement result.

20 Claims, 11 Drawing Sheets

FIG. 3

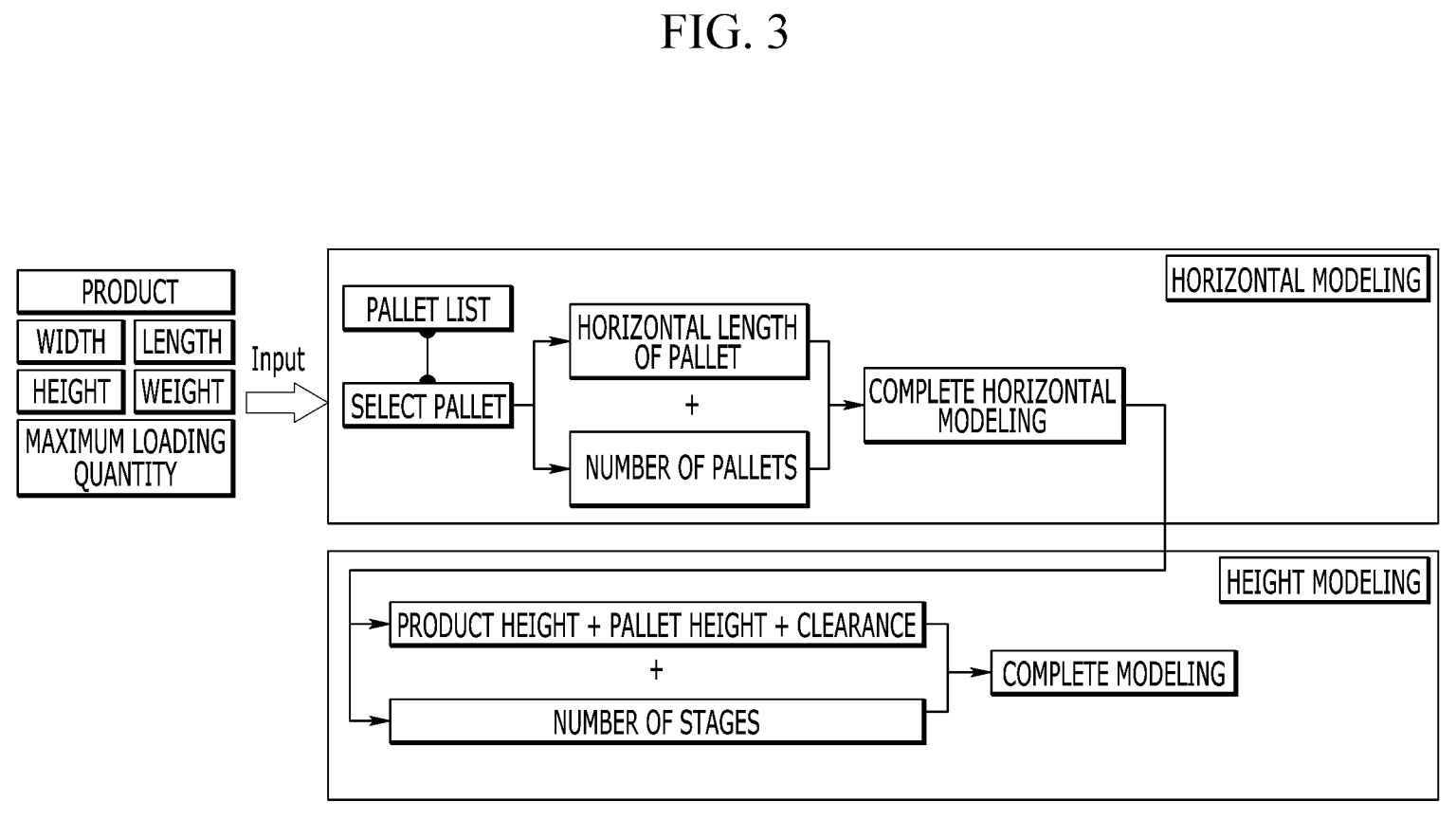

PRODUCT
WIDTH
LENGTH
HEIGHT
WEIGHT
MAXIMUM LOADING QUANTITY
Input
HORIZONTAL MODELING
PALLET LIST
SELECT PALLET
HORIZONTAL LENGTH OF PALLET
+
NUMBER OF PALLETS
COMPLETE HORIZONTAL MODELING
HEIGHT MODELING
PRODUCT HEIGHT + PALLET HEIGHT + CLEARANCE
+
NUMBER OF STAGES
COMPLETE MODELING

DEVICE AND METHOD FOR PLACING RACKS

CROSS-REFERENCE TO RELATED APPLICATIONS

This application claims the benefit of Korean Patent Application No. 10-2023-0049481, filed on Apr. 14, 2023, and Korean Patent Application No. 10-2023-0099359, filed on Jul. 31, 2023, which applications are hereby incorporated herein by reference.

TECHNICAL FIELD

The present disclosure relates to device and method for placing racks.

BACKGROUND

As production of goods is increased after the emergence of an industrialized society, a trade has been gradually expanded, thus increasing not only the production of the goods but also interest in distribution of the goods. Logistics complexes are established to improve a distribution structure, and interest in logistics and storage facilities is also increasing. In general, a logistics warehouse may be a means of storing the goods or raw materials from a producer such as a manufacturer temporarily or for a long period of time. With the development of road transportation, the emergence of distribution companies such as large discount stores and home shopping, and the vitalization of a delivery industry, a role of the logistics warehouse has been increased and developed into a logistics center for each company and each distribution company which are equipped with a large-scale facility. The goods may be transported and loaded in the logistics warehouse by using a lift, a forklift, or the like to ensure efficient placing, warehousing, and shipping of the goods, as well as convenience for inventory management. In particular, a plurality of racks (or rack structures) each having a width and a height that allow a pallet to be loaded and unloaded may be used to make a logistics process efficient. Research on rack placement simulation is actively conducted to utilize a space in the logistics center.

SUMMARY

Embodiments of the present disclosure provide a device and a method for placing racks that use a modeling algorithm capable of effectively performing rack placement in a rack placement simulation.

According to an embodiment, a device for placing racks includes a rack modeling calculation formula-provision module providing a predetermined rack modeling calculation formula for the rack including at least one of a pallet, a load beam, a frame column, a connection part between the load beam and the frame column, and a support, a rack modeling module performing rack modeling by calculating the rack modeling calculation formula based on a value of a preset variable, a rack placement module placing the rack modeled based on a predetermined rack placement condition, and a recommendation module recommending a transportation device or a pallet, which is suitable for the rack placement, based on a rack placement result.

The rack modeling calculation formula-provision module may provide a calculation formula for at least one of a load beam length, a stage depth, a stage height, a total frame column height, a maximum allowable weight, a stage loading capacity, a total rack length, and a pallet size.

The rack modeling module may perform the rack modeling by calculating the rack modeling calculation formula based on at least one of a horizontal size of the frame column, a horizontal size of the pallet, a first clearance, the stage height, a load beam thickness, a second clearance, a pallet depth, a pallet loading correction, a pallet height, a maximum product height, and a pallet clearance.

The rack modeling module may perform the modeling for the horizontal size of the frame column to be fixed, the horizontal size of the pallet to be variable depending on a product, the first clearance to be fixed and range from 75 mm to 150 mm, the stage height to be variable depending on the product, the load beam thickness to be variable depending on a weight, the second clearance to be fixed to be 150 mm, the pallet depth to be variable depending on the product, the pallet loading correction to be 100 mm, the pallet height to range from 75 mm to 160 mm depending on a product type, the maximum product height to be variable depending on the product, and the pallet clearance to range from zero mm to 100 mm.

The rack modeling module may receive product information, and the product information may include information on width, length, height, weight, and maximum loading quantity of the product, may select the pallet capable of loading the product, and may perform horizontal modeling based on a horizontal length of the pallet and the required number of pallets.

The rack modeling module may perform height modeling based on a product height, the pallet height, the clearance, and the number of stages after completing the horizontal modeling.

The rack placement module may acquire the number of racks by dividing the load beam length from the total length and may acquire a remaining space length by subtracting a multiplication value of the load beam length and the number of racks from the total length.

The rack placement module may adjust a horizontal size of the rack by changing a pallet type or the number of pallets when determining the remaining space length is unsuitable.

The rack placement module may acquire the load beam length by adding a horizontal length of the pallet, the number of pallets, and a frame column thickness.

The recommendation module may recommend a pallet type and the number of pallets which have the smallest remaining space length.

The rack placement module may calculate an aisle width based on the turning radius, front overhang, fork length, and safety clearance of the transportation device and may select another transportation device from a transportation device list and repeat the calculation on the aisle width when determining that the aisle width is unsuitable.

The row number of the racks may be acquired by dividing an addition value of a rack length and the aisle width from the total length, and the recommendation module may recommend the transportation device having a maximum row number of racks.

The rack placement module may model the stage number of racks by substituting a lifting height of the transportation device.

The recommendation module may recommend the transportation device having a maximum stage number of racks.

The rack modeling may be performed by performing crossover and mutation calculations when the modeled rack fails to satisfy a termination condition based on its suitability in an initial result and then evaluating the suitability again.

Spatial coordinates of each rack may be produced based on a rack value input based on a rack reference point, and three-dimensional (3D) data of the product may be input to the produced spatial coordinates.

According to another embodiment, a method for placing racks includes providing a predetermined rack modeling calculation formula for the rack including at least one of a pallet, a load beam, a frame column, a connection part between the load beam and the frame column, and a support, performing rack modeling by calculating the rack modeling calculation formula based on a value of a preset variable, placing the rack modeled based on a predetermined rack placement condition, and recommending a transportation device or a pallet, which is suitable for the rack placement, based on a rack placement result.

In the providing of the rack modeling calculation formula, provided is a calculation formula for at least one of a load beam length, a stage depth, a stage height, a total frame column height, a maximum allowable weight, a stage loading capacity, a total rack length, and a pallet size.

In the performing of the rack modeling, the rack modeling may be performed by calculating the rack modeling calculation formula based on at least one of a horizontal size of the frame column, a horizontal size of the pallet, a first clearance, the stage height, a load beam thickness, a second clearance, a pallet depth, a pallet loading correction, a pallet height, a maximum product height, and a pallet clearance.

The rack modeling may be performed by performing crossover and mutation calculations when the modeled rack fails to satisfy a termination condition based on its suitability in an initial result and then evaluating the suitability again.

Embodiments of the present disclosure may maximize the space storage efficiency and increase the sales by effectively performing the optimal rack placement in consideration of the various conditions without relying on the experience of the professional company. In addition, embodiments of the present disclosure may shorten the three-dimensional (3D) construction time of the logistics center by manufacturing the rack in 3D by simply inputting the numbers for each rack type and may be applied not only to the simple rack but also to the standardized facility. In addition, embodiments of the present disclosure may shorten the time to build the asset in 3D, thus making it possible to build the various places in 3D. Accordingly, the user may easily produce the rack by inputting the numbers and perform the free placement by using the produced racks.

BRIEF DESCRIPTION OF THE DRAWINGS

FIGS. 3 to 6 are views for explaining rack modeling according to an embodiment.

DETAILED DESCRIPTION OF ILLUSTRATIVE EMBODIMENTS

Figure 1:
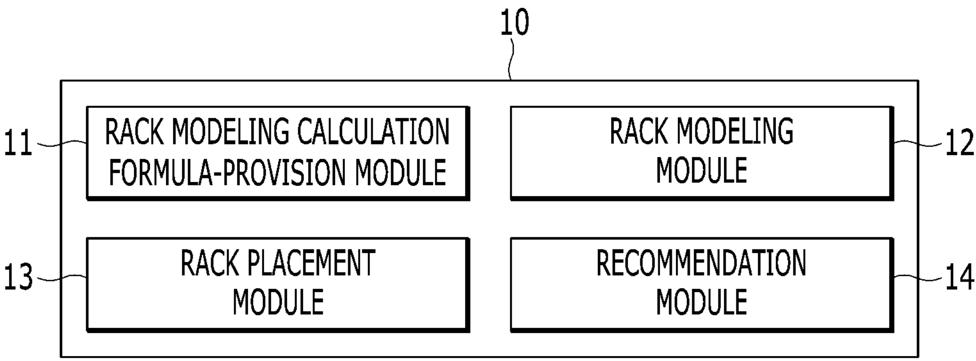
FIG. 1 is a block diagram for explaining a device for placing racks according to an embodiment.

Hereinafter, embodiments of the present disclosure will be described in detail with reference to the accompanying drawings so that those skilled in the art to which the present disclosure pertains may easily practice embodiments of the present disclosure. Embodiments of the present disclosure may be implemented in various different forms and are not limited to the embodiments provided herein. In addition, in the drawings, portions unrelated to the description are omitted to clearly describe embodiments of the present disclosure, and similar portions are denoted by similar reference numerals throughout the specification.

Through the present specification and claims, unless explicitly described otherwise, "including" any components will be understood to imply the inclusion of another component rather than the exclusion of another component. Terms including ordinal numbers such as "first," "second", and the like may be used to describe various components. However, these components are not limited by these terms. The terms are used only to distinguish one component from another component.

Terms such as "~part", "~er/or", and "module" described in the specification may refer to a unit capable of processing at least one function or operation described in the specification, which may be implemented as hardware, a circuit, software, or a combination of hardware or circuit and software. In addition, at least some components or functions of a device and a method for placing racks according to the embodiments described below may be implemented as a program or software, and the program or software may be stored in a computer-readable medium.

FIG. 1 is a block diagram for explaining a device for placing racks according to an embodiment.

Referring to FIG. 1, a device 10 for placing racks according to an embodiment may include a rack modeling calculation formula-provision module 11, a rack modeling module 12, a rack placement module 13, and a recommendation module 14.

The rack modeling calculation formula-provision module 11 may provide a rack modeling calculation formula to increase space storage efficiency in rack placement simulation for space utilization of a logistics center. In detail, the rack modeling calculation formula-provision module 11 may provide the predetermined rack modeling calculation formula for the rack including at least one of a pallet, a load beam, a frame column, a connection part between the load beam and the frame column, and a support. Here, the calculation formula may include a calculation formula for at least one of a load beam length, a stage depth, a stage height, a total frame column height, a maximum allowable weight, a stage loading capacity, a total rack length, and a pallet size.

The rack modeling module 12 may perform rack modeling by calculating the rack modeling calculation formula based on a value of a preset variable. In detail, the rack modeling module 12 may perform the rack modeling by calculating the rack modeling calculation formula based on at least one of a horizontal size of the frame column, a horizontal size of the pallet, a first clearance, the stage height, a load beam thickness, a second clearance, a pallet depth, a pallet loading correction, a pallet height, a maximum product height, and a pallet clearance. In some examples, the rack modeling module 12 may perform the modeling for the horizontal size of the frame column to be fixed, the horizontal size of the pallet to be variable depending on a product, the first clearance to be fixed and range from 75 mm to 150 mm, the stage height to be variable depending on the product, the load beam thickness to be variable depending on a weight, the second clearance to be fixed to be 150 mm, the pallet depth to be variable depending on the product, the pallet loading correction to be 100 mm, the pallet height to range from 75 mm to 16*o* mm depending on a product type, the maximum product height to be variable depending on the product, and the pallet clearance to range from zero mm to 100 mm.

In some examples, the rack modeling module 12 may receive product information, and the product information may include information on width, length, height, weight, and maximum loading quantity of the product. The rack modeling module 12 may select the pallet capable of loading the product and perform horizontal modeling based on a horizontal length of the pallet and the required number of pallets. In addition, the rack modeling module 12 may perform height modeling based on a product height, the pallet height, the clearance, and the number of stages after completing the horizontal modeling.

The rack placement module 13 may place the rack modeled by the rack modeling module 12 based on a predetermined rack placement condition.

In some examples, the rack placement module 13 may acquire the number of racks by dividing the load beam length from the total length and acquire a remaining space length by subtracting a multiplication value of the load beam length and the number of racks from the total length. The rack placement module 13 may adjust a horizontal size of the rack by changing a pallet type or the number of pallets when determining the remaining space length is unsuitable. Meanwhile, the rack placement module 13 may acquire the load beam length by adding the horizontal length of the pallet, the number of pallets, and a frame column thickness.

The recommendation module 14 may recommend a transportation device or a pallet, which is suitable for the rack placement, based on a rack placement result of the rack placement module 13.

In some examples, the recommendation module 14 may recommend the pallet type and the number of pallets which have the smallest remaining space length.

In some examples, the rack placement module 13 may calculate an aisle width based on the turning radius, front overhang, fork length, and safety clearance of the transportation device and may select another transportation device from a transportation device list and repeat the calculation on the aisle width when determining that the aisle width is unsuitable. Here, the row number of the racks may be acquired by dividing an addition value of a rack length and the aisle width from the total length, and the recommendation module 14 may recommend the transportation device having a maximum row number of racks.

In some examples, the rack placement module 13 may model the stage number of racks by substituting a lifting height of the transportation device. In addition, the recommendation module 14 may recommend the transportation device having a maximum stage number of racks.

This kind of rack modeling may be performed by performing crossover and mutation calculations when the modeled rack fails to satisfy a termination condition based on its suitability in an initial result and then evaluating the suitability again.

The embodiments of the present disclosure may maximize space storage efficiency and increase sales by effectively performing optimal rack placement in consideration of various conditions without relying on an experience of a professional company.

Figure 2:
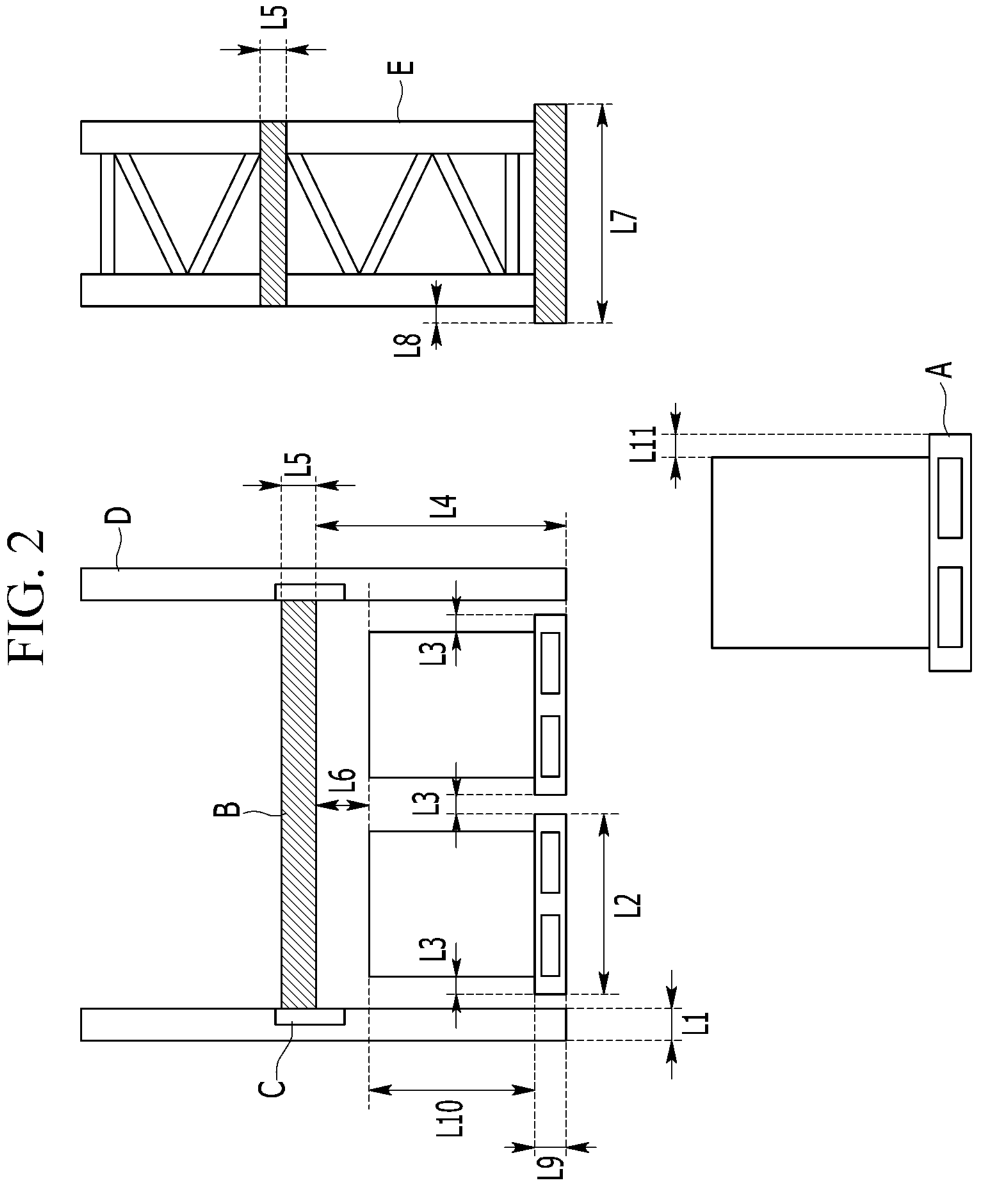
FIG. 2 is a view for explaining a rack modeling calculation formula according to an embodiment.

FIG. 2 is a view for explaining the rack modeling calculation formula according to an embodiment.

Referring to FIG. 2, the rack modeling calculation formula may be determined based on at least one of a horizontal size L1 of the frame column, a horizontal size L2 of the pallet, a first clearance L3, a stage height L4, a load beam thickness L5, a second clearance L6, a pallet depth L7, a pallet loading correction L8, a pallet height L9, a maximum product height L10, and a pallet clearance L11. Here, the horizontal size of the frame column may be fixed, the horizontal size of the pallet may be variable depending on the product, the first clearance may be fixed and range from 75 mm to 150 mm, the stage height may be variable depending on the product, the load beam thickness may be variable depending on the weight, the second clearance may be fixed and may be 150 mm, the pallet depth may be variable depending on the product, the pallet loading correction may be 100 mm, the pallet height may range from 75 mm to 160 mm depending on the product type, the maximum product height may be variable depending on the product, and the pallet clearance may range from zero mm to 100 mm. In the drawing, A, B, C, D, and E may respectively represent the pallet, the load beam, the connection part, the column, and the support. The rack modeling calculation formula may be determined as follows:

$$\text{load beam length} = (\mathrm{L}_2 + L_3) \times \text{number of pallets} + 3,$$

$$\text{stage length} = L_7 - (L8 \times 2),$$

$$\text{stage height} = \mathrm{L}_9 + L_{10} + L6,$$

$$\text{total frame column height} = (\text{stage height} + \mathrm{L}_5) \times \text{number of stages} - \mathrm{L}_5,$$

$$\text{maximum allowable weight} = \text{maximum load weight (2000 to 2500 kg) determined by frame section and length},$$

$$\text{stage loading capacity} = (\text{pallet weight} + \text{product weight}) \times \text{number of pallets} < \text{maximum allowable weight},$$

$$\text{total rack length} = \text{load beam length} + (\text{column thickness } \mathrm{X}_2), \text{ and}$$

$$\text{pallet size} = \text{product size} + \mathrm{L}_{11}.$$

FIGS. 3 to 6 are views for explaining rack modeling according to an embodiment.

Referring to FIG. 3, a pallet matching the product size may be selected from a pallet list when inputting the product information including the information on the width, length, height, weight, and maximum loading quantity of the product. The modeling may be completed by performing the height modeling based on the height, the pallet height, the clearance, and the number of stages when the horizontal modeling is completed by being performed based on the horizontal length of the pallet and the required number of pallets.

Figure 4:
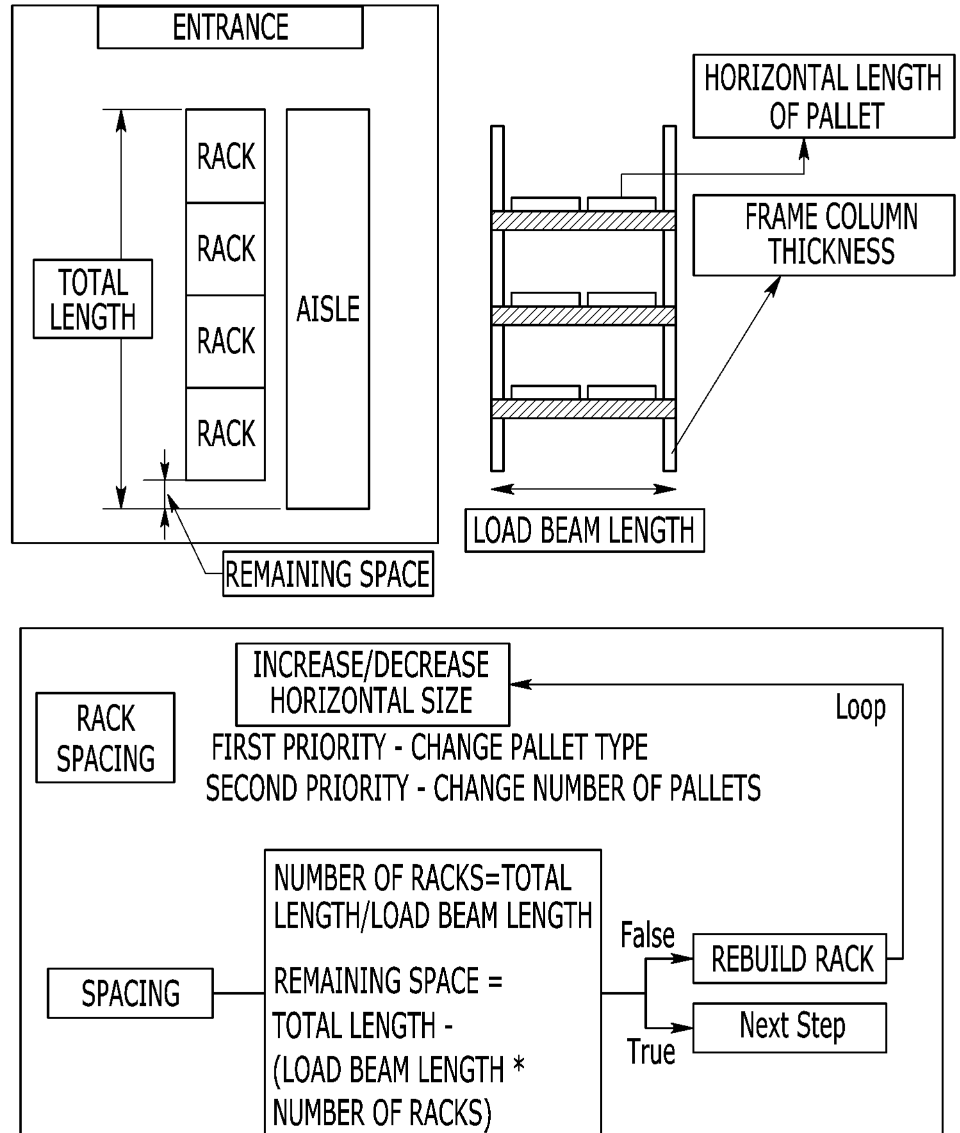

Referring to FIG. 4, the number of racks and the remaining space length may be calculated to model rack spacing. The number of racks may be calculated by dividing the load beam length from the total length, and the remaining space length may be calculated by subtracting the multiplication value of the load beam length and the number of racks from the total length. The step above may proceed to the next step when the acquired number of racks or the remaining space length is determined to be suitable, and the horizontal size of the rack may be increased or decreased by changing the pallet type or the number of pallets when the acquired number of racks or the remaining space length is determined to be unsuitable. The load beam length may be calculated by adding the number of pallets and the frame column thickness.

Figure 5:
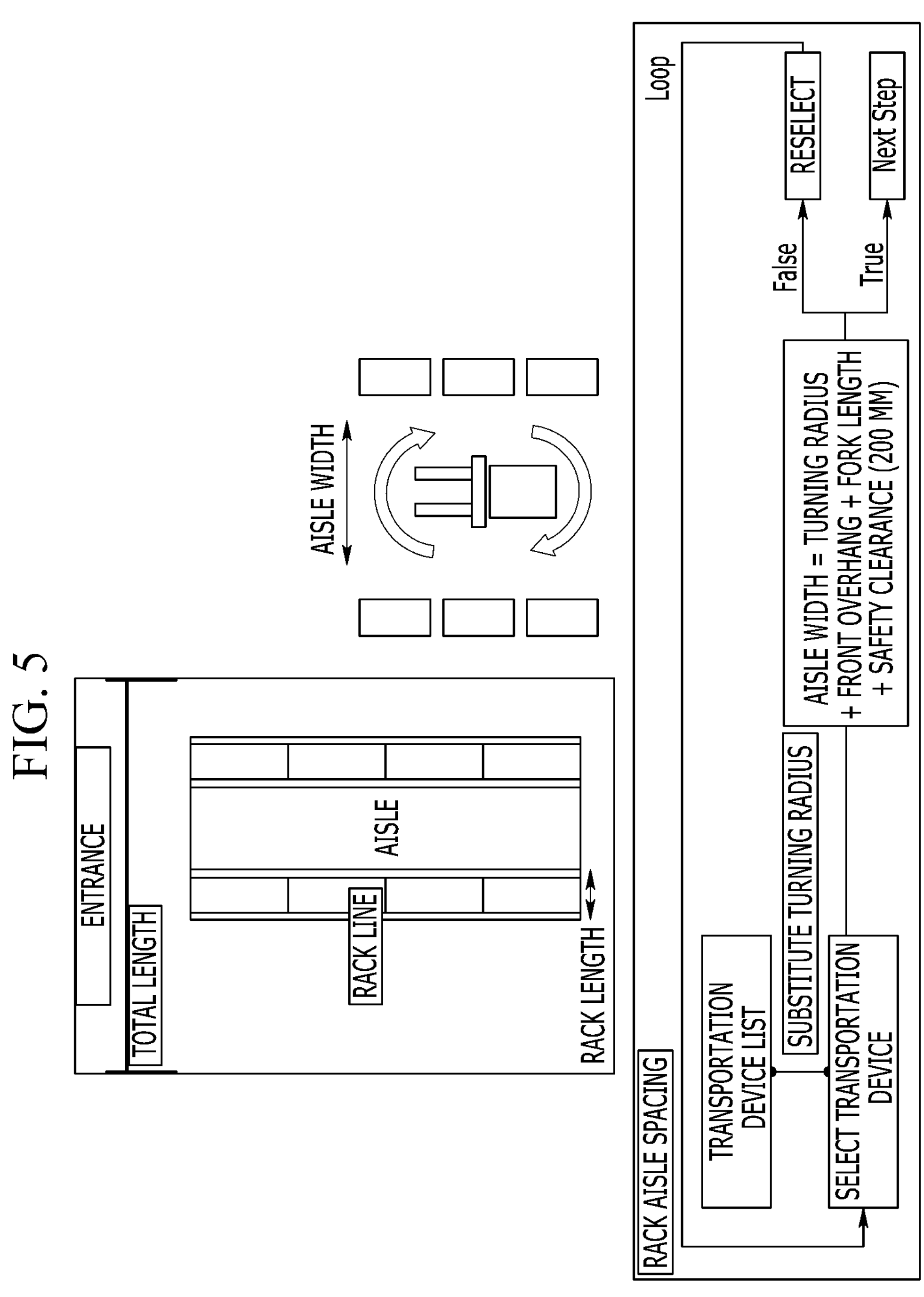

Referring to FIG. 5, in order to model rack aisle spacing, the aisle width may be calculated based on the turning radius, front overhang, fork length, and safety clearance of the transportation device. Here, the transportation device may be selected by substituting the turning radius in the transportation device list. The step above may proceed to the next step when the acquired aisle width is determined to be suitable, and another transportation device may be selected from the transportation device list and the calculation of the aisle width may be repeated when the acquired aisle width is determined to be unsuitable. Here, the row number of racks may be acquired by dividing the addition value of the rack length and the aisle width from the total length, and the transportation device having the maximum row number of racks may be recommended to a user.

Figure 6:
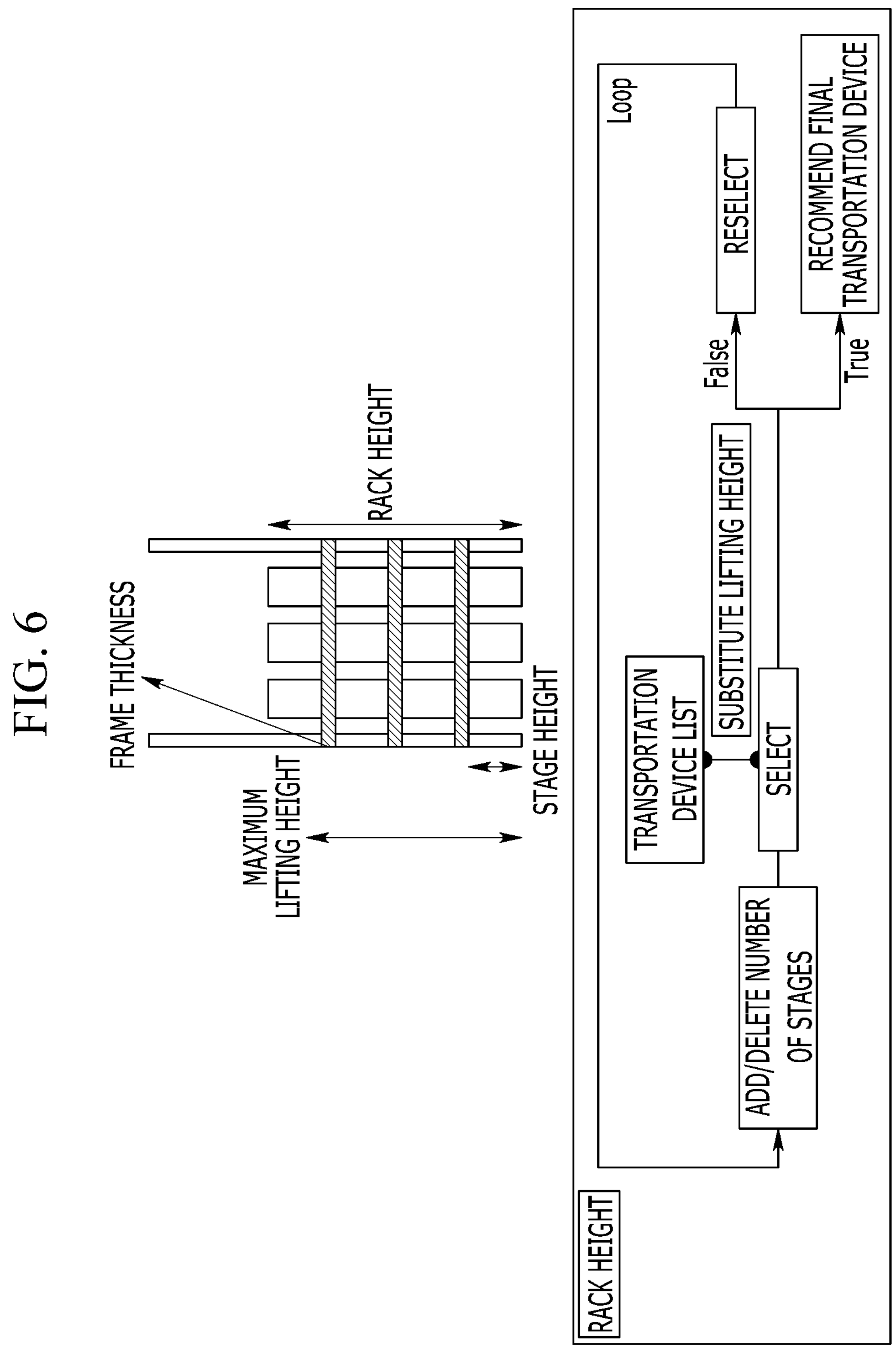

Referring to FIG. 6, in order to model the rack height, the above step may proceed to the next step when the rack height is determined to be suitable in consideration of the lifting height of the selected transportation device, and the transportation device having the maximum stage number of racks may be recommended by adding or deleting the stage number when the rack height is determined to be unsuitable.

Figure 7:
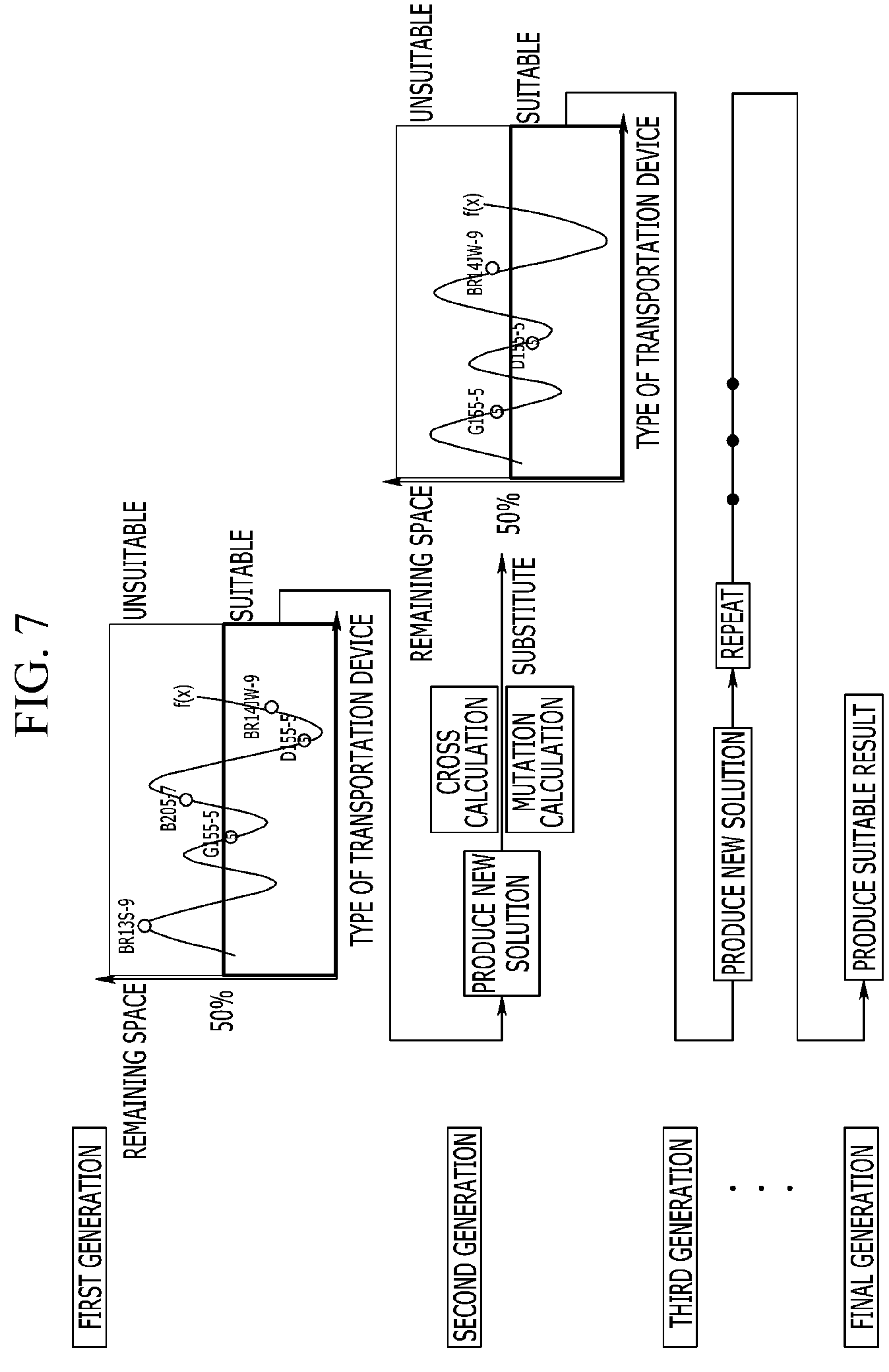
FIG. 7 is a view to explain that rack modeling is performed by a genetic algorithm according to an embodiment.

FIG. 7 is a view to explain that rack modeling is performed by a genetic algorithm according to an embodiment.

Referring to FIG. 7, the rack modeling may be performed by performing the crossover and mutation calculations when the modeled rack fails to satisfy the termination condition based on its suitability in the initial result and then evaluating the suitability again. In detail, in a first generation, among the transportation devices, BR13S-9 and B205-7 may be determined to be unsuitable, and G155-5, D155-5, and BR14JW-9 may be determined to be suitable. In a second generation, G155-5 and BR14JW-9 may be determined to be unsuitable, and D155-5 may be determined to be suitable as a result of evaluating their suitability by performing the crossover and mutation calculations to produce a new solution. A suitable result may be finally acquired by repeating this process for several generations.

That is, the device for placing racks according to an embodiment may use the genetic algorithm and perform genetic algorithm optimization. In detail, it is possible to perform optimal modeling and layout arrangement, which match an optimal value by repeating the generations in such a way that each element list is substituted into the algorithm, a good result is selected after the evaluation to produce a new substitution list, and the produced substitution list is applied to the algorithm again. This genetic algorithm may be the most suitable algorithm model for acquiring an optimal solution and may be suitable for solving a complex problem which is impossible to be calculated.

Figure 8:
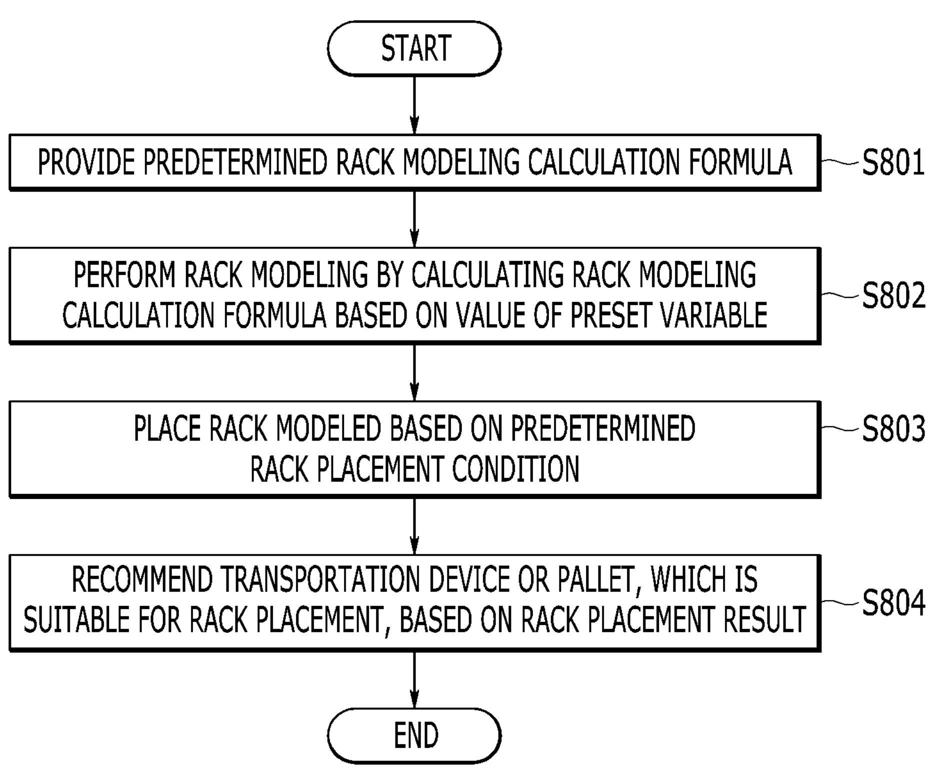
FIG. 8 is a flowchart for explaining a method for placing racks according to another embodiment.

FIG. 8 is a flowchart for explaining a method for placing racks according to another embodiment.

Referring to FIG. 8, the method for placing racks according to another embodiment may include providing a predetermined rack modeling calculation formula for the rack including at least one of a pallet, a load beam, a frame column, a connection part between the load beam and the frame column, and a support (S801), performing rack modeling by calculating the rack modeling calculation formula based on a value of a preset variable (S802), placing the rack modeled based on a predetermined rack placement condition (S803), and recommending a transportation device or a pallet, which is suitable for the rack placement, based on a rack placement result (S804).

Specific details of the method for placing racks may refer to the description of the embodiments described in this specification, and the description provided here thus omits a redundant description thereof.

Figure 9:
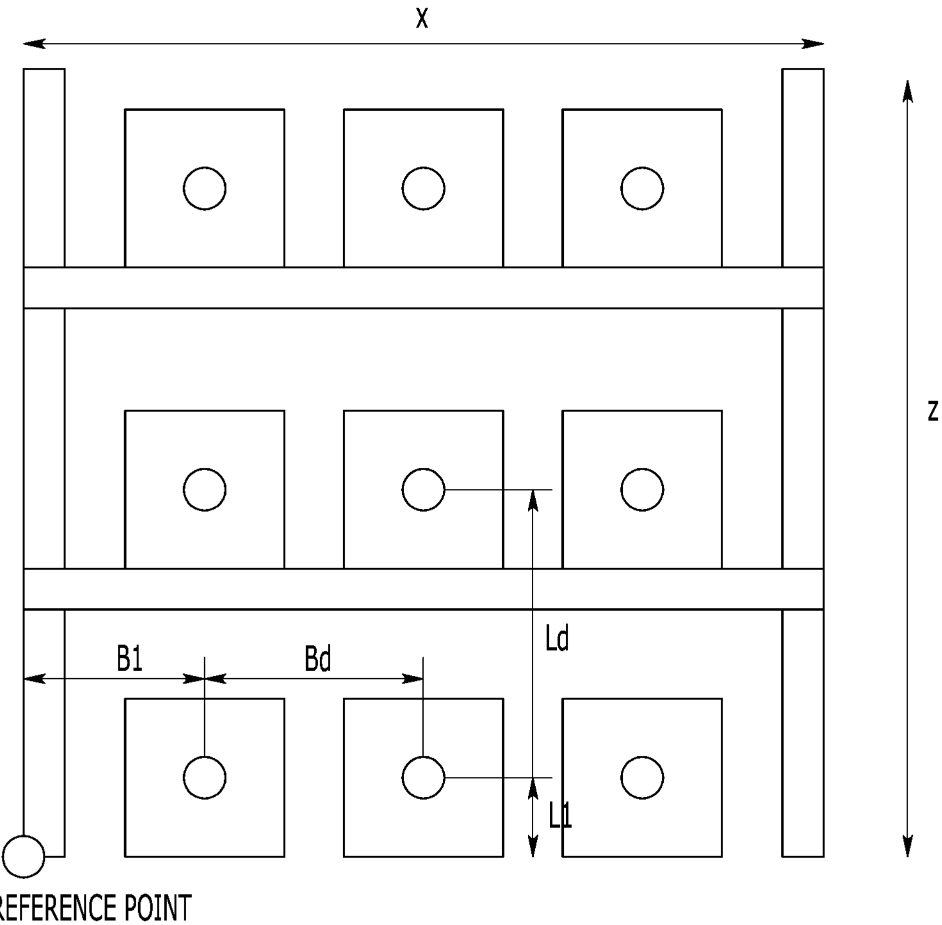
FIGS. 9 and 10 are views for explaining a rack configuration method according to an embodiment.
Figure 10:
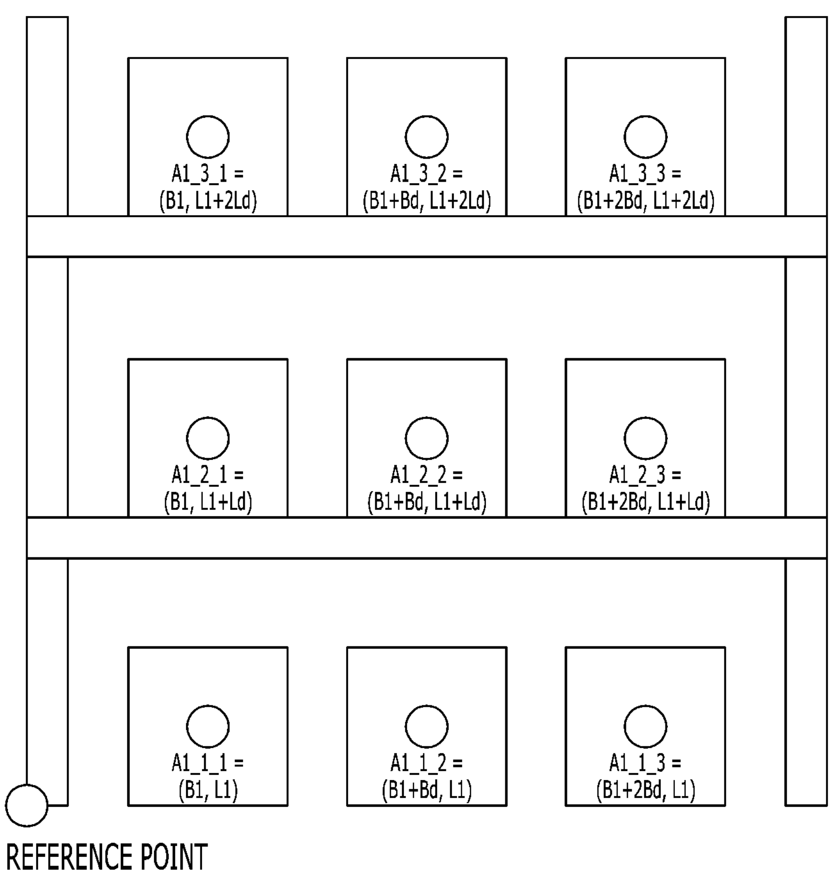

FIGS. 9 and 10 are views for explaining a rack configuration method according to an embodiment.

Referring to FIGS. 9 and 10, spatial coordinates of each rack may be produced based on a rack value input based on a rack reference point, and 3D data of the product may be input to the produced spatial coordinates. In detail, the device 10 for placing racks according to an embodiment may configure the rack by receiving its total height, width, length, beam thickness, layer number of the racks, row number of the racks, or the like, calculate the input value to build a 3D shape of the rack, and specify the coordinates based on a loading space in the rack.

TABLE 1

| Item | Content |
|---|---|
| Rack_type | Rack type name |
| x | Total rack length |
| y | Total rack width |
| z | Total rack height |
| Rx | X-axis angle of rack (default value of zero) |
| Ry | Y-axis angle of rack (default value of zero) |
| Rz | Z-axis angle of rack (default value of zero) |
| Bin_Limit (BL) | Maximum loading column in one row of rack |
| Level_Limit (LL) | Maximum loading row of rack |
| Bd = x/BL | Distance between bins |
| Ld = z/LL | Distance between levels |
| B1 = Bd/2 | Distance to first bin |
| L1 = Ld/2 | Height of first row |

According to this embodiment, the device 10 for placing racks may produce the spatial coordinates of each rack based on the rack value input based on the rack reference point (zero, zero) and input the 3D data of the product into the produced spatial coordinates. Embodiments of the present disclosure may shorten three-dimensional (3D) construction time of the logistics center by manufacturing the rack in 3D by simply inputting numbers for each rack type and may be applied not only to a simple rack but also to a standardized facility. In addition, embodiments of the present disclosure may shorten time to build an asset in 3D, thus making it possible to build various places in 3D. Accordingly, the user may easily produce the rack by inputting the numbers and perform free placement by using the produced racks. These features may correspond to functions serving as a foundation for easily building a 3D logistics center because it is possible to select a suitable rack based on spacing (usually 11M and variable for each logistics center) between columns in the logistics center by inputting specifications of the rack required for the logistics center and placing the produced rack in advance in the 3D logistics center.

Figure 11:
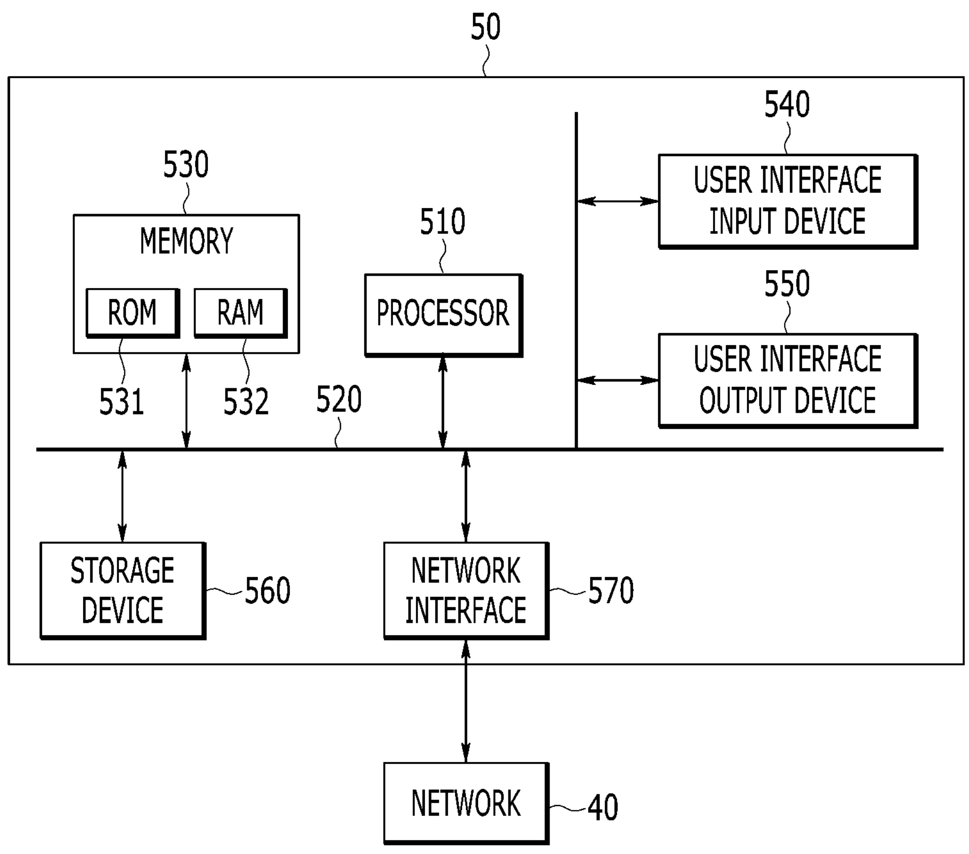
FIG. 11 is a view for explaining a computing device according to still another embodiment.

FIG. 11 is a view for explaining a computing device according to still another embodiment.

Referring to FIG. 11, the device and method of a vehicle for placing racks according to the embodiments may be implemented using a computing device 50.

The computing device 50 may include at least one of a processor 510, a memory 530, a user interface input device 540, a user interface output device 550, and a storage device (i.e., a memory) 560 performing communication through a bus 520. The computing device 50 may also include a network interface 570 electrically connected to a network 40. The network interface 570 may transmit or receive a signal with another entity through the network 40.

The processor 510 may be implemented in any of various types such as a micro controller unit (MCU), an application processor (AP), a central processing unit (CPU), a graphic processing unit (GPU), or a neural processing unit (NPU), and the memory 530 may be any semiconductor device executing an instruction stored in the storage device **56*o*. The processor 510 may implement the functions and methods described above with respect to FIGS. 1 to 10**.

The memory 530 and the storage device **56*o* may include various types of volatile or non-volatile storage media. For example, the memory 530 may include a read only memory (ROM) 531 and a random access memory (RAM) 532. In this embodiment, the memory 530 may be disposed inside or outside the processor 510 and may be connected to the processor 510** through various means that are well-known.

In some examples, at least some components or functions of the device and method of a vehicle for placing racks according to the embodiments may be implemented as a program or software implemented by the computing device 50, and the program or software may be stored in the computer-readable medium. In detail, the computer-readable medium according to this embodiment may be a program for executing steps included in the method for placing racks according to another embodiment recorded on a computer including the processor 510 executing the program or instruction stored in the memory 530 or the storage device 560.

In some examples, at least some components or functions of the device and method of a vehicle for placing racks according to the embodiments may be implemented using hardware or circuitry of the computing device 50 or implemented using a separate hardware or circuitry that may be electrically connected to the computing device 50.

According to the embodiments described hereinabove, various transportation devices such as a forklift, a large goods vehicle (LGV), and an automated guided vehicle (AGV) are used to transport the goods from the logistics warehouse. For the forklift alone, there are 100 models or more in Korea, and each forklift has a different specification. A rack placement plan in the logistics center may be made using such a transportation device. The plan may be a time-consuming task and have high calculation complexity to configure an optimal layout by reflecting the turning radius and lifting height of every transportation device. Embodiments of the present disclosure may help the user make a quick decision by resolving this difficulty by recommending the optimal layout and transportation device suitable for the layout through a modeling automation algorithm and a genetic algorithm.

In addition, a layout design is currently performed through an empirical solution to maximize storage efficiency in a limited space. However, the most optimal space efficiency may be converted into data by substituting various elements configuring the space by applying a rack placement optimization algorithm.

In addition, the genetic algorithm is one of algorithms that are fundamental to machine learning and deep learning. The genetic algorithm may be developed into deep learning and machine learning algorithms and may quickly simulate the optimal layout by learning the most optimal layout.

In some examples, various racks may be used in a loading space, and the racks may require various shapes depending on each type when the loading rack is configured in three dimensions (3D). It may take a lot of time to draw the rack in 3D, and the rack may be easily implemented through basic rack information. In addition, the product loading space in the rack may be automatically provided to implement the logistics center in 3D.

In addition, in some examples, embodiments of the present disclosure may receive basic information on the rack, automatically calculate the rack placement through the received information, and automatically complete the rack through calculated values. Accordingly, embodiments of the present disclosure may shorten time for rack configuration during the rack configuration in 3D and facilitate configurations of various facilities as a digital twin market is increased.

Although the embodiments of the present disclosure have been described in detail hereinabove, the scope of the present disclosure is not limited thereto. That is, various modifications and alterations made by those skilled in the art to which the present disclosure pertains by using a basic concept of the present disclosure as defined in the following claims also fall within the scope of the present disclosure.

What is claimed is:

1. A device for placing racks, the device comprising:

a rack modeling calculation formula-provision module configured to provide a predetermined rack modeling calculation formula for the racks comprising a pallet, a load beam, a frame column, a connection part between the load beam and the frame column, or a support;

a rack modeling module configured to perform rack modeling by calculating the rack modeling calculation formula based on a value of a preset variable;

a rack placement module configured to place the racks modeled based on a predetermined rack placement condition; and a recommendation module configured to recommend a transportation device or a pallet suitable for placement of the racks based on a rack placement result.

2. The device of claim 1, wherein the rack modeling calculation formula-provision module is configured to provide a calculation formula for a load beam length, a stage depth, a stage height, a total frame column height, a maximum allowable weight, a stage loading capacity, a total rack length, or a pallet size.

3. The device of claim 2, wherein the rack modeling module is configured to perform the rack modeling by calculating the rack modeling calculation formula based on a horizontal size of the frame column, a horizontal size of the pallet, a first clearance, the stage height, a load beam thickness, a second clearance, a pallet depth, a pallet loading correction, a pallet height, a maximum product height, or a pallet clearance.

4. The device of claim 3, wherein the rack modeling module is configured to perform the modeling for the horizontal size of the frame column to be fixed, the horizontal size of the pallet to be variable depending on a product, the first clearance to be fixed and range from 75 mm to 150 mm, the stage height to be variable depending on the product, the load beam thickness to be variable depending on a weight, the second clearance to be fixed to be 150 mm, the pallet depth to be variable depending on the product, the pallet loading correction to be 100 mm, the pallet height to range from 75 mm to **16*o*** mm depending on a product type, the maximum product height to be variable depending on the product, and the pallet clearance to range from zero mm to 100 mm.

5. The device of claim 1, wherein the rack modeling module is configured to:

receive product information comprising information on width, length, height, weight, and maximum loading quantity of a product;

select the pallet capable of loading the product; and perform horizontal modeling based on a horizontal length of the pallet and a required number of pallets.

6. The device of claim 5, wherein the rack modeling module is configured to perform height modeling based on the height of the product, a height of the pallet, clearance, and the number of stages after completing the horizontal modeling.

7. The device of claim 1, wherein the rack placement module is configured to:

acquire a number of the racks by dividing a load beam length from a total length; and acquire a remaining space length by subtracting a multiplication value of the load beam length and the number of the racks from the total length.

8. The device of claim 7, wherein the rack placement module is configured to adjust a horizontal size of each of the racks by changing a pallet type or a number of the pallets in response to a determination that the remaining space length is unsuitable.

9. The device of claim 7, wherein the rack placement module is configured to acquire the load beam length by adding a horizontal length of the pallet, a number of the pallets, and a frame column thickness.

10. The device of claim 9, wherein the recommendation module is configured to recommend a pallet type and the number of the pallets that have the smallest remaining space length.

11. The device of claim 1, wherein the rack placement module is configured to:

calculate a first aisle width based on a turning radius, front overhang, fork length, and safety clearance of the transportation device; and select another transportation device from a transportation device list and calculate a second aisle width in response to a determination that the first aisle width is unsuitable.

12. The device of claim 1, wherein:

a row number of the racks is acquired by dividing an addition value of a rack length and an aisle width from a total length; and the recommendation module is configured to recommend the transportation device having a maximum row number of racks.

13. The device of claim 1, wherein the rack placement module is configured to model a stage number of the racks by substituting a lifting height of the transportation device.

14. The device of claim 13, wherein the recommendation module is configured to recommend the transportation device having a maximum stage number of racks.

15. The device of claim 1, wherein the rack modeling module is configured to perform the rack modeling by performing crossover and mutation calculations in response to the modeled rack failing to satisfy a termination condition based on its suitability in an initial result and then evaluating the suitability again.

16. The device of claim 1, wherein:

spatial coordinates of each of the racks are based on a rack value input based on a rack reference point; and three-dimensional (3D) data of a product is input to the produced spatial coordinates.

17. A method for placing racks, the method comprising:

providing a predetermined rack modeling calculation formula for the racks including a pallet, a load beam, a frame column, a connection part between the load beam and the frame column, or a support;

performing rack modeling by calculating the rack modeling calculation formula based on a value of a preset variable;

placing the racks modeled based on a predetermined rack placement condition; and recommending a transportation device or a pallet suitable for the rack placement based on a rack placement result.

18. The method of claim 17, wherein providing the rack modeling calculation formula comprises providing a calculation formula for a load beam length, a stage depth, a stage height, a total frame column height, a maximum allowable weight, a stage loading capacity, a total rack length, and a pallet size.

19. The method of claim 17, wherein performing the rack modeling comprises performing the rack modeling by calculating the rack modeling calculation formula based on a horizontal size of the frame column, a horizontal size of the pallet, a first clearance, a stage height, a load beam thickness, a second clearance, a pallet depth, a pallet loading correction, a pallet height, a maximum product height, or a pallet clearance.

20. The method of claim 17, wherein the rack modeling is performed by performing crossover and mutation calculations in response to the modeled rack failing to satisfy a termination condition based on its suitability in an initial result and then evaluating the suitability again.

* * * * *